United States Patent
Uchida

(10) Patent No.: US 8,834,774 B2
(45) Date of Patent: Sep. 16, 2014

(54) IMPRINTING METHOD AND APPARATUS THEREFOR

(75) Inventor: Shinji Uchida, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 12/427,881

(22) Filed: Apr. 22, 2009

(65) Prior Publication Data

US 2009/0261514 A1  Oct. 22, 2009

(30) Foreign Application Priority Data

Apr. 22, 2008  (JP) ................................. 2008-111761

(51) Int. Cl.
*B29C 59/16* (2006.01)
*G11B 5/855* (2006.01)
*B82Y 40/00* (2011.01)
*G03F 7/00* (2006.01)
*B82Y 10/00* (2011.01)

(52) U.S. Cl.
CPC ................. *G11B 5/855* (2013.01); *B82Y 40/00* (2013.01); *G03F 7/0002* (2013.01); *B82Y 10/00* (2013.01)
USPC .......................................... 264/446; 264/447

(58) Field of Classification Search
USPC .................. 264/319, 447, 293, 446, 494, 132
See application file for complete search history.

(56) References Cited

U.S. PATENT DOCUMENTS

| | | | |
|---|---|---|---|
| 6,272,275 B1 | 8/2001 | Cortright et al. | |
| 6,322,342 B1 * | 11/2001 | Mitamura | 425/28.1 |
| 7,343,857 B2 | 3/2008 | Sakuarai et al. | |
| 2003/0211410 A1 * | 11/2003 | Irie | 430/22 |
| 2005/0116370 A1 * | 6/2005 | Ogino et al. | 264/40.1 |
| 2005/0158163 A1 | 7/2005 | Harper et al. | |
| 2005/0284320 A1 | 12/2005 | Sakuarai et al. | |
| 2006/0115584 A1 | 6/2006 | Hattori et al. | |

(Continued)

FOREIGN PATENT DOCUMENTS

| | | |
|---|---|---|
| JP | 2004-356560 A | 12/2004 |
| JP | 2005-56535 A | 3/2005 |

(Continued)

OTHER PUBLICATIONS

Office Action issued in Japanese Patent Application 2008-111761 dated Oct. 5, 2012.

(Continued)

*Primary Examiner* — Larry Thrower
*Assistant Examiner* — Xue Liu
(74) *Attorney, Agent, or Firm* — Rossi, Kimms & McDowell LLP

(57) ABSTRACT

An imprinting method forms a predetermined pattern in a resist surface of a substrate coated with a photo-curing type resist by using a mold having a pattern of projections and recesses formed in a transfer surface. The method includes an alignment step, a press step, a UV irradiation step, and a release step. The steps are performed in plural units selected from independent units, composite units, and combinations of independent units and composite units. The mold and the substrate are paired with each other and conveyed between the units. An imprinting apparatus includes plural units which perform the steps in the imprinting method and which are selected from independent units in each of which one step is executed, composite units in each of which plural of steps are executed, and combinations of independent units and composite units; and conveying devices which convey the mold and the substrate.

5 Claims, 9 Drawing Sheets

(56) References Cited

U.S. PATENT DOCUMENTS

| | | |
|---|---|---|
| 2006/0245855 A1 | 11/2006 | Hamada |
| 2006/0286193 A1* | 12/2006 | Ando et al. .................. 425/385 |
| 2007/0077325 A1 | 4/2007 | Yu |
| 2007/0200276 A1* | 8/2007 | Mackey et al. ............... 264/293 |
| 2008/0041816 A1 | 2/2008 | Choo |
| 2010/0025878 A1 | 2/2010 | Uchida |

FOREIGN PATENT DOCUMENTS

| | | |
|---|---|---|
| JP | 2005-108351 A | 4/2005 |
| JP | 2005-135957 A | 5/2005 |
| JP | 2005-153091 A | 6/2005 |
| JP | 2005-286222 A | 10/2005 |
| JP | 2006-062208 A | 3/2006 |
| JP | 2006-310698 A | 11/2006 |
| JP | 2006-326927 A | 12/2006 |
| JP | 2008-046580 A | 2/2008 |

OTHER PUBLICATIONS

Office Action issued in corresponding Japanese patent application No. JP2008-111761, issued Feb. 21, 2012. Partial English translation provided.

Japanese Office Action for JP 2008-111762, mail date Apr. 27, 2012. In co-pending U.S. Appl. No. 12/427,886. Partial translation provided.

* cited by examiner

SUBSTRATE     SUBSTRATE OVER
              CIRCUMFERENCE
              HOLDING MEMBER

IMPRINTING METHOD AND APPARATUS THEREFOR

BACKGROUND

The present invention relates to an imprinting method and an apparatus therefor. Imprinting is a method in which a molding surface of a mold having very fine projections and recesses formed therein is pressed against a resin applied on a substrate to thereby transfer the shape of the molding surface to the resin.

In recent years, the capacities of hard disk drives have tended to increase and the recording densities of magnetic recording media have thus been increased. As track density increases in accordance with the increase in recording density, a leakage magnetic field is produced from a side surface of a head gap at the time of data writing. The leakage magnetic field causes production of noise to reduce S/N of a playback signal because unnecessary recording called 'side fringe' is performed on a region between adjacent tracks.

To avoid such a disadvantage, for example, a discrete track type magnetic recording medium having grooves provided between adjacent tracks has been proposed in JP-A-2005-56535. In the discrete track type magnetic recording medium, adjacent tracks are separated from each other so that the 'side fringe' problem can be avoided. On the other hand, a patterned medium has been proposed to form 1-bit dots on a disk for the purpose of improving recording density greater.

In either of the discrete track medium and the patterned medium, a minute pattern is formed on a disk. In most cases, the patterning is performed by an imprinting method. The imprinting method uses a mold having a minute pattern formed in a molding surface as a prototype mold for transferring the minute pattern to a surface of a substrate coated with a resin. Thermal imprinting using a thermoplastic resin and photo imprinting using a photo-curing type resin are known as the imprinting method. Particularly, imprinting for forming a minute pattern with a nano-meter size is called 'nano-imprinting'.

The photo imprinting is as follows. After a substrate is placed on a stage, a photo-curing type resin is applied on a surface of the substrate. Then, a mold having a molding surface formed therein is pressed against the surface of the substrate by a predetermined load. In this condition, the surface of the substrate is irradiated with ultraviolet light for a predetermined period to harden the photo-curing type resin. Then, the mold is released from the substrate, so that the substrate having the photo-curing type resin onto which a convex shape corresponding to the concave shape formed in the molding surface of the mold has been transferred is taken out from the stage.

An example of an imprinting apparatus made from three units, that is, a substrate setting unit, a resin coating unit and a processing unit has been disclosed in JP-A-2006-326927. The processing unit performs alignment of a transfer body with a stamper, pressurization and release. In this example, a conveyance robot is disposed in the center while the three units are disposed in different directions shifted by 90 degrees viewed from the conveyance robot.

In nano-imprinting commonly known at present, all nano-imprinting steps are performed in one place in one apparatus. The nano-imprinting steps are an alignment step for aligning a pattern of a mold with a predetermined position of a substrate, a press step for pressing the pattern surface of the mold against a surface of a resist applied on the substrate, a UV irradiation step for hardening the resist by UV irradiation and a release step for releasing the mold from the substrate.

That is, because a mold provided as an expensive prototype mold produced by electron beam exposure has been heretofore used, it may be said that substrates are one by one subjected to the series of nano-imprinting steps using one mold.

A tact time of 100 or more sheets per hour is however required of either of the discrete track medium and the patterned medium. The required tact time cannot be achieved if all the series of nano-imprinting steps are performed in one apparatus.

The imprinting apparatus disclosed in JP-A-2006-326927 is an apparatus in which: a substrate is set by the substrate setting unit; the substrate is conveyed to the resin coating unit and coated with a photosensitive resin; the substrate is conveyed to the processing unit and subjected to alignment of a transfer body with a stamper, pressurization and release; and the processed substrate is conveyed to the substrate setting unit again and taken out. The configuration of the imprinting apparatus disclosed in JP-A-2006-326927 is the same as in the case where all the series of nano-imprinting steps are performed in one apparatus.

In recent years, it has been possible to produce a large number of clone molds inexpensively from a very expensive prototype mold (e.g. see JP-A-2005-286222). The use of the large number of clone molds has permitted each step to be performed on an assembly line while the mold and the substrate are paired with each other.

In view of the above, it would be desirable to provide a method for performing nano-imprinting efficiently, and an apparatus therefor. The invention was developed in consideration of such circumstances.

SUMMARY OF THE INVENTION

The imprinting method according to the invention is an imprinting method for forming a predetermined pattern in a resist surface of a substrate coated with a photo-curing type resist by using a mold having a transfer surface provided with a pattern of projections and recesses formed therein, including at least: aligning the pattern of the mold with a predetermined position of the substrate (alignment step); pressing the pattern surface of the mold against the resist surface of the resist-coated substrate (press step); irradiating the resist with ultraviolet light to cure the resist (UV irradiation step); and releasing the mold from the substrate (release step), wherein: the steps in the imprinting method are performed in a plurality of units selected from independent units in each of which one step is executed, composite units each of which a plurality of steps are executed, and combinations of independent units and composite units; and conveyance steps for conveying the mold and the substrate paired with each other between the units are provided between the units.

Further, the imprinting apparatus according to the invention is an apparatus for carrying out the imprinting method, including: a plurality of units which perform the steps in the imprinting method and which are selected from independent units in each of which one step is executed, composite units in each of which a plurality of steps are executed, and combinations of independent units and composite units; and conveying devices which convey the mold and the substrate paired with each other between the plurality of units.

According to the invention, a series of imprinting processes in production of discrete track media, patterned media, etc. are executed on an assembly line so that imprinting can be performed efficiently in a short tact time.

Other features, advantages, modifications and embodiments of the invention will become apparent to those skilled in the art from the following detailed description of the preferred embodiments of the invention.

BRIEF DESCRIPTION OF THE DRAWINGS

The invention will be described with reference to certain preferred embodiments thereof and the accompanying drawings, wherein.

DETAILED DESCRIPTION OF THE PREFERRED EMBODIMENTS

Figure 1:
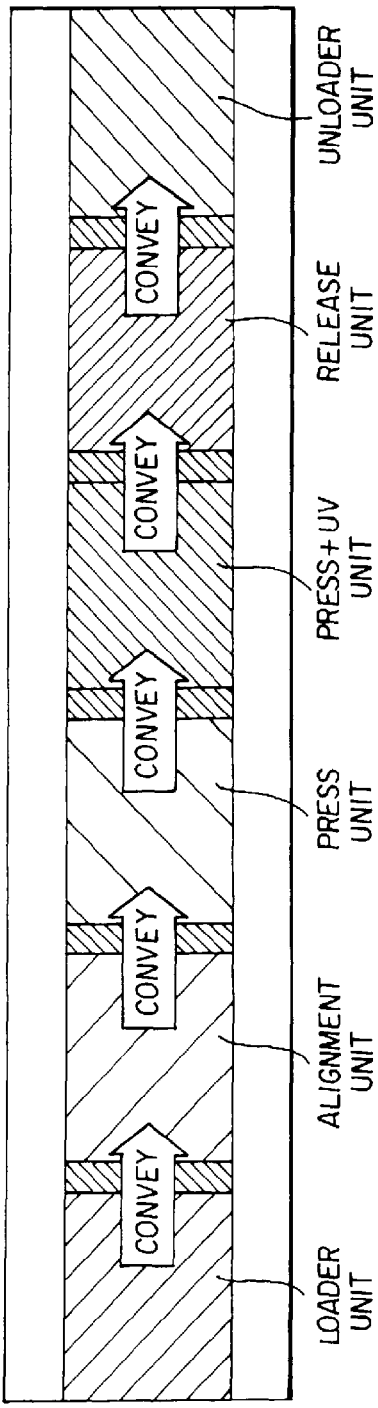
FIG. 1 is a schematic view showing an example of configuration of an apparatus according to the invention.

An imprinting method according to the invention will be described first. In the imprinting method according to the invention, a mold having a recessing and projecting pattern formed in a transfer surface and a substrate coated with a photo-curing type resist are used so that a predetermined pattern is formed in the resist surface of the substrate. The mold used herein is not an expensive prototype mold but one of a large number of clone molds copied from the prototype mold.

The imprinting method according to the invention includes at least the steps of: aligning a pattern of a mold with a predetermined position of a substrate (alignment step); pressing the pattern surface of the mold against a surface of a resist applied on the substrate (press step); irradiating the resist with ultraviolet light to harden the resist (UV irradiation step); and releasing the mold from the substrate (release step). Generally, a loading step for setting the mold and the substrate coated with the photo-curable resist in an imprinting apparatus is provided before the alignment step, and an unloading step for taking out the mold and the substrate having a predetermined pattern formed in the resist surface and released from the mold by the release step is provided after the release step.

In the imprinting method, the steps are performed in a plurality of units selected from independent units in each of which one step is executed, composite units in each of which a plurality of steps are executed, and combinations of independent units and composite units. Since the UV irradiation step is performed in the condition that the pattern surface of the mold is pressed against the surface of the resist applied on the substrate by the press step, the press step and the UV irradiation step are usually performed in a composite unit. However, the press step may be separated into a press step for forming a predetermined pattern shape in the resist surface of the substrate and a press step for keeping the pattern shape during UV irradiation so that the former press step can be executed in an independent unit while the latter press step and the UV irradiation step can be executed in a composite unit. Alternatively, the composite unit may be provided for three steps so that the release step can be executed together with the press step and the UV irradiation step in the composite unit.

Operations usually used in the nano-imprinting method can be used as operations performed in the alignment, press, UV irradiation and release steps.

A conveyance step for conveying the mold and the substrate paired with each other from a unit to an adjacent unit is provided between the units. When three or more units are provided and conveyance steps are provided, the conveyance steps can be driven independently. Consequently, while the time required for processing in each unit is considered, the mold and the substrate can be conveyed to the next unit successively. Accordingly, imprinting can be performed on an assembly line, so that imprinting can be performed efficiently in a short tact time.

In the imprinting method according to the invention, it is preferable that the mold and the substrate are conveyed to the press unit while kept in tight contact with each other after the alignment step. Since the mold and the substrate are conveyed while kept in tight contact with each other, the mold and the substrate can be more prevented from being relatively displaced from each other when they are conveyed.

In the imprinting method according to the invention, it is preferable that the steps from the conveyance step up to the UV irradiation step after the alignment step are performed under reduced pressure. When these steps are performed under reduced pressure, voids can be easily prevented from being involved in the pattern.

When a series of operations from inputting into the loader unit to outputting from the unloader unit are performed under reduced pressure, particles in the air can be restrained from being mixed into the pattern so that defects of the pattern caused by the particles and failure of the mold caused by the involved particles can be prevented.

The imprinting apparatus according to the invention will be described below with reference to the drawings. The configuration of each unit will be described first on the case where the apparatus according to the invention is configured as shown in FIG. 1 by way of example.

FIG. 1 is a schematic view showing an example of configuration of the apparatus according to the invention. As shown in FIG. 1, the apparatus includes a loader unit, an alignment unit, a press unit, a UV irradiation composite unit, a release unit, and an unloader unit. The loader unit is provided to perform a loading step for setting a mold and a substrate coated with the photo-curing type resist into the imprinting apparatus. The alignment unit is provided to perform an alignment step for aligning a pattern of the mold with a predetermined position of the substrate. The press unit is provided to perform a press step for forming a predetermined patterned shape in a resist surface of the substrate. The composite unit is provided to perform a UV irradiation step while the press state for keeping the patterned shape is kept. The release unit is provided to perform a release step for releasing the mold from the substrate. The unloader unit is provided to perform an unloading step for taking out the substrate released from the mold and the mold. Conveying devices are provided between the loader unit and the alignment unit, between the alignment unit and the press unit, between the press unit and the composite unit (press+UV irradiation unit), between the composite unit and the release unit and between the release unit and the unloader unit, respectively.

Figure 6:
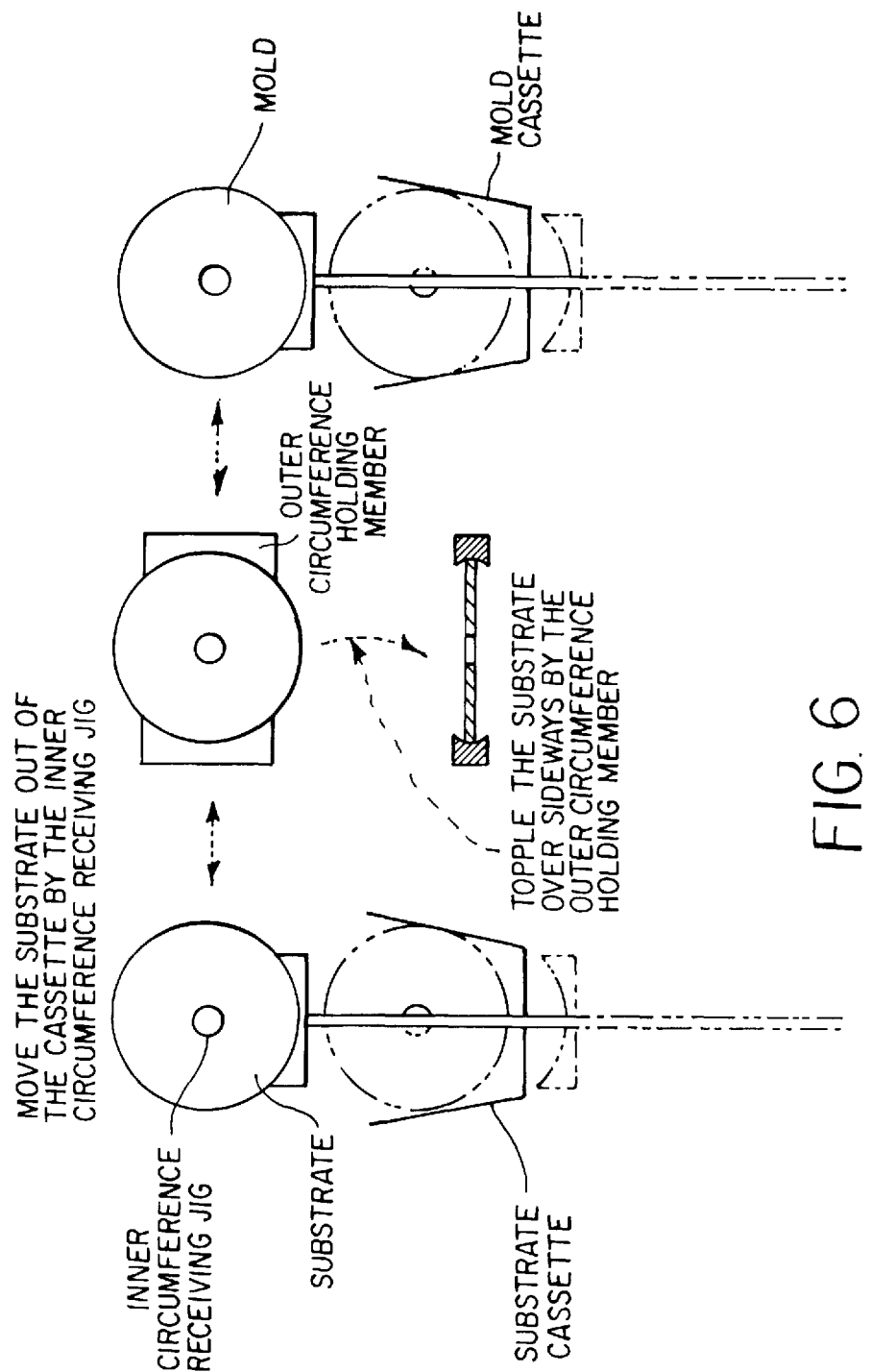
FIG. 6 is a view for explaining sandwich arrangement of a substrate and a mold in a loader unit.
Figure 7:
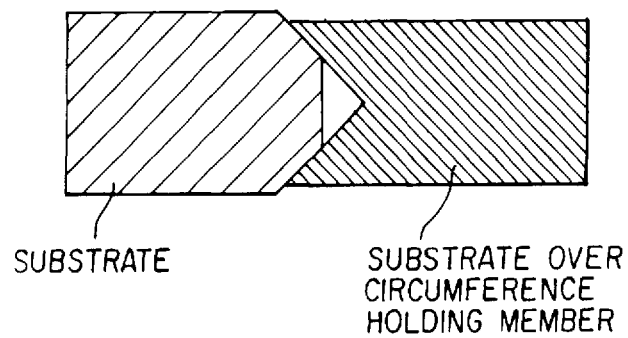
FIG. 7 is an enlarged sectional view of the substrate and an outer circumference holding member.

The loader unit extracts substrates one by one from a substrate cassette, extracts molds one by one from a mold cassette and sets each substrate-mold pair with a gap. The loader unit has a push pin for pushing out each substrate or mold, a cassette moving mechanism for moving a predetermined substrate or mold to the position of the push pin, an inner circumference receiving jig for receiving the substrate or mold pushed out by the push pin and holding the inner circumference of the substrate or mold, an inner circumference receiving jig moving mechanism for moving the inner circumference receiving jig to a predetermined position, and an outer circumference holding member for holding the outer circumference of the substrate or mold in a predetermined position and setting each substrate-mold pair with a gap. Substrates and molds can be set by the following method. As shown in FIG. 6, substrates and molds are pushed out alternately from the substrate cassette and the mold cassette by the push pins. The inner circumference receiving jig receives each substrate or mold and moves the substrate or mold to a predetermined position. In the predetermined position, the outer circumference holding member holds the outer circumference of the substrate or mold and the inner circumference receiving jig is removed. In the position, substrates and molds are toppled over sideways so alternately that the substrates and molds are piled up alternately. FIG. 7 shows a state where a substrate or mold is held by the outer circumference holding member.

Figure 8:
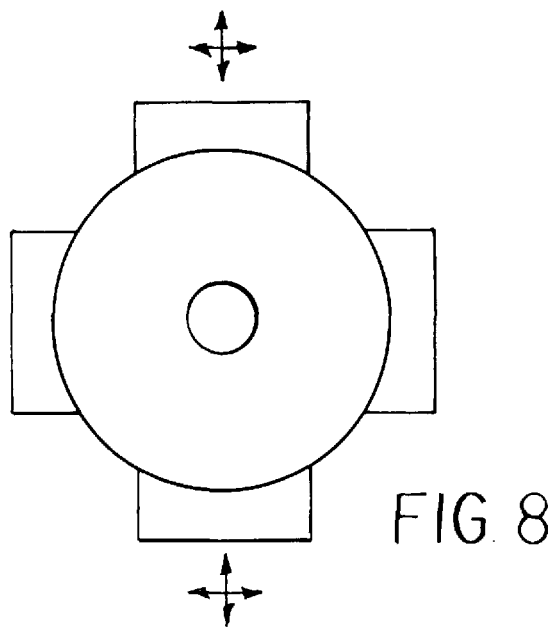
FIG. 8 is a plan view showing a state where the substrate and the mold are concentrically aligned with each other while the outer circumferences of the substrate and the mold are held.
Figure 9A:
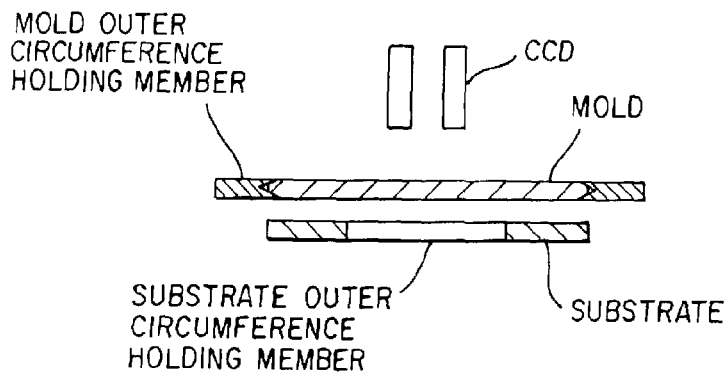
FIG. 9A is a side view showing a state after the substrate and the mold are concentrically aligned with each other while the outer circumferences of the substrate and the mold are held.
Figure 9B:
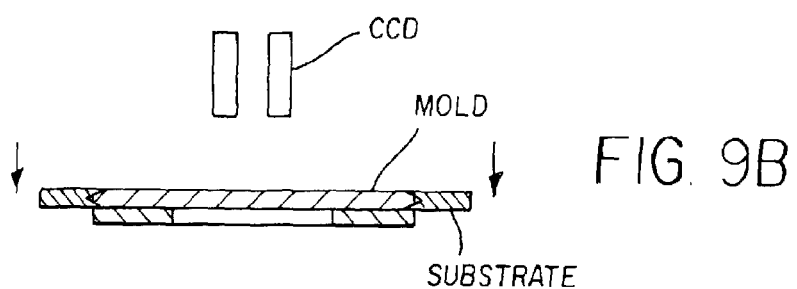
FIG. 9B is a side view showing a state where the substrate and the mold are brought into contact with each other after the concentric alignment.
Figure 10:
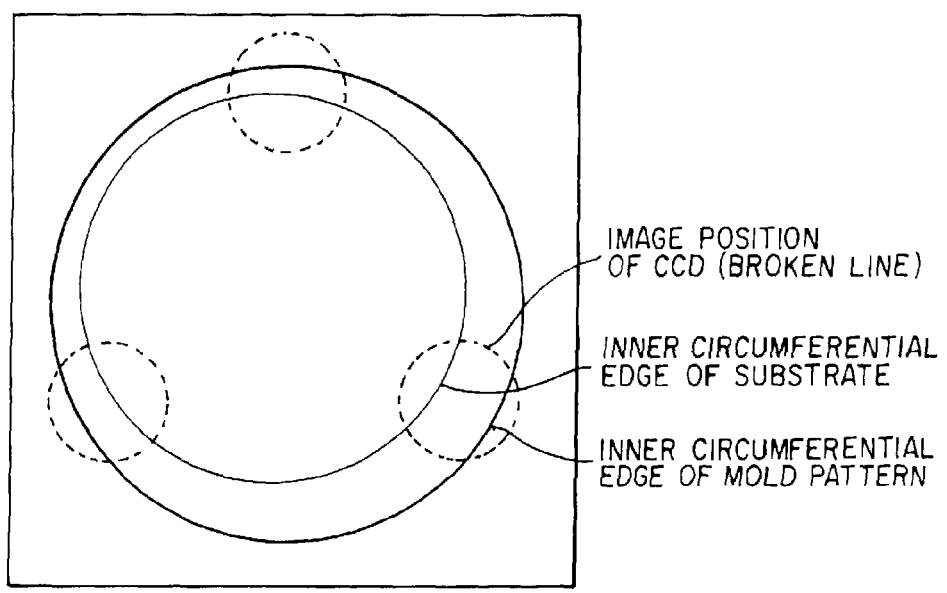
FIG. 10 is an enlarged view of the vicinity of an inner circumference of the substrate, showing image positions of CCD in alignment.

The alignment unit has a CCD camera, a substrate moving mechanism for moving the substrate in a plane direction, and a mold moving mechanism for moving the mold in a direction perpendicular to the plane direction. As shown in FIG. 10, the CCD camera confirms the inner circumference edge position of the mold and determines the concentric position of the mold. Similarly, the CCD camera confirms the inner circumference edge position of the substrate and determines the concentric position of the substrate. Then, as shown in FIGS. 8 and 9A, the substrate moving mechanism moves the substrate in a plane direction so that the concentric position of the substrate coincides with the concentric position of the mold. Then, the mold moving mechanism moves the mold in a direction perpendicular to the plane direction so that the mold comes into contact with the substrate coated with a resist, as shown in FIG. 9B. When the mold comes into contact with the substrate coated with the resist, the mold and the substrate are fixed to each other by the surface tension of the resist so that the position of the mold relative to the substrate can be kept. Accordingly, the mold and the substrate in this state can be conveyed to the press unit.

The press unit has a pressing machine, a precision tool (die set) set in the pressing machine, and fixing arms for locking the precision tool after pressing. Guide pins and guide bushes are incorporated in upper and lower press plates to prevent the precision tool from being pressed obliquely. The upper press plate, a central portion (facing the substrate) of a guide bush board (in which the guide bushes are incorporated) and a tool upper plate provided under the central portion of the guide bush board are made of a UV transmissible material. For example, quartz can be used as the UV transmissible material.

Figure 11A:
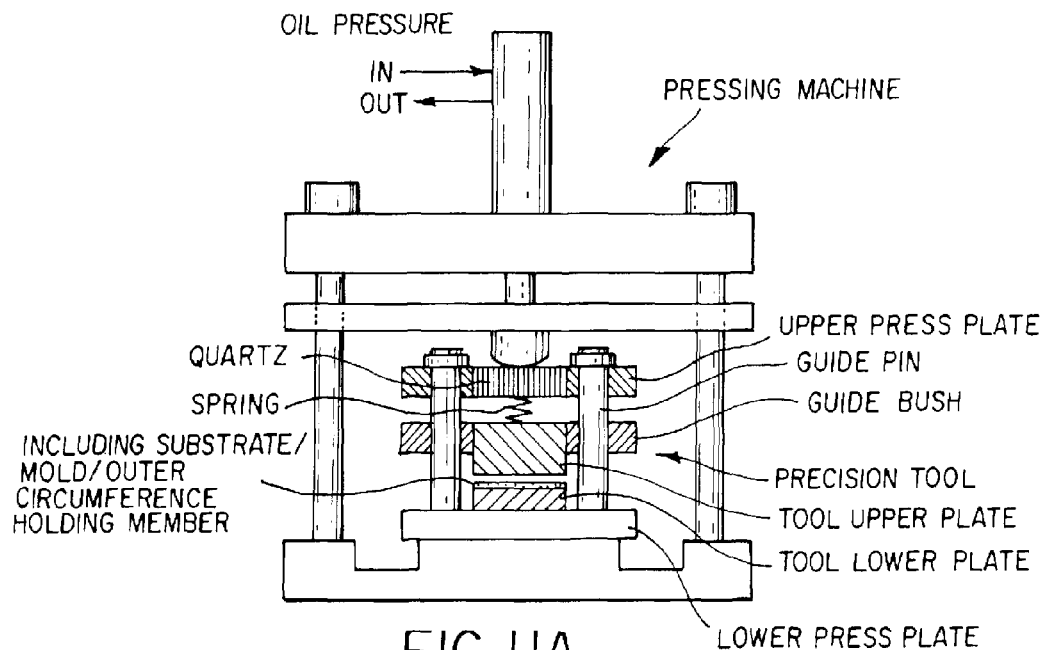
FIG. 11A is a vertical sectional view showing a precision tool disposed in a pressing machine before pressing.
Figure 11B:
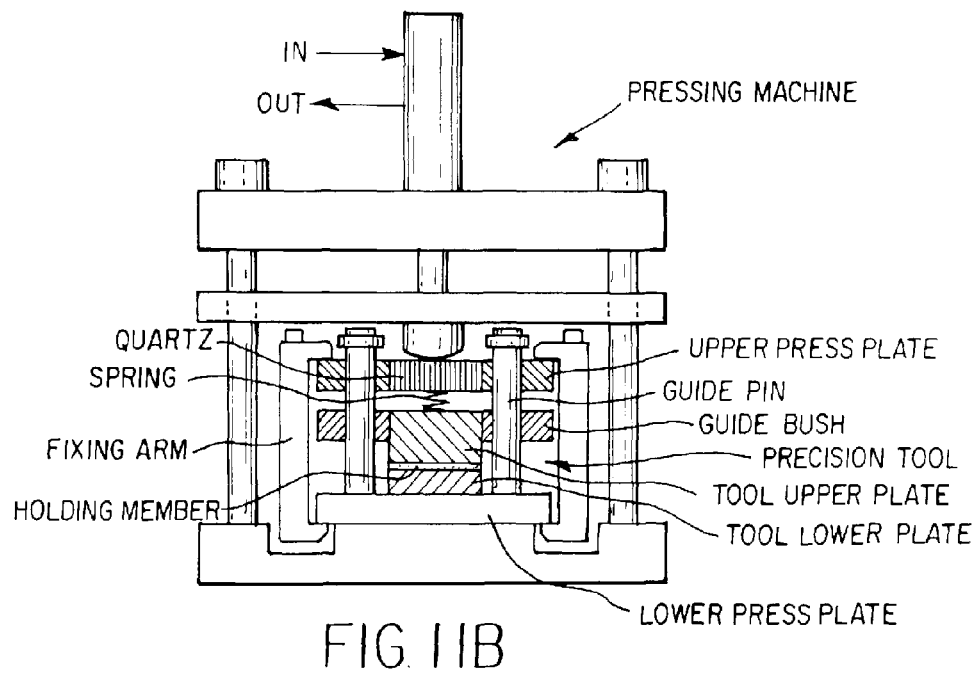
FIG. 11B is a vertical sectional view showing the precision tool locked with fixing arms after pressing.

A spring is provided between the upper press plate and the guide bush board so as to be located in the central position (corresponding to the central holes of the substrate and the mold). As shown in FIG. 11A, the substrate-mold pair introduced into the press unit is mounted between the tool lower and upper plates of the precision tool on the lower press plate while the substrate and mold outer circumference holding members remain in the substrate-mold pair. The pressing machine applies a pressure of about 0.1 to 10 MPa to the substrate-mold pair. As shown in FIG. 11B, in the state where the pressing machine applies the pressure to the substrate-mold pair, fixing arms are attached to the precision tool. After the fixing arms are screwed up so that the precision tool is locked with the fixing arms, the locked precision tool is taken out and conveyed to the UV irradiation unit. Because the guide pins and the guide bushes are incorporated in the upper and lower press plates of the precision tool, the pressure acts in a direction perpendicular to the pattern surface so that the minute pattern of the mold can be transferred to the resist accurately without destruction of the minute pattern.

Figure 12:
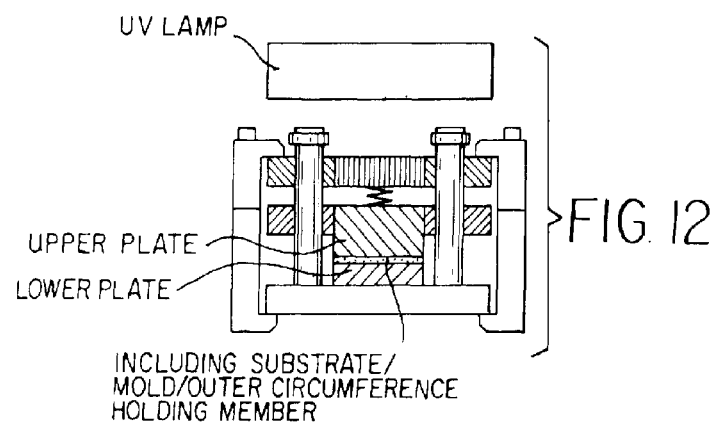
FIG. 12 is a vertical sectional view showing important part of a UV irradiation unit.

As shown in FIG. 12, the UV irradiation unit has a UV lamp in its upper portion. UV irradiation is performed through a window portion of the precision tool in a state where the substrate-mold pair is pressed. The window portion is made of the UV transmissible material. When double-side imprinting is required, a UV lamp may be provided in the lower portion in addition to the UV lamp provided in the upper portion and a window made of the UV transmissible material may be provided in the lower plate of the precision tool so that UV irradiation can be performed from upper and lower surfaces. After UV irradiation, the precision tool is conveyed to the release unit.

Figure 13A:
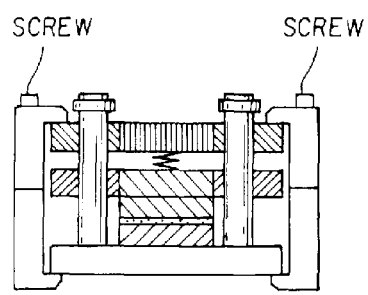
FIGS. 13A to 13E are views showing a releasing procedure in a release unit.
Figure 13B:
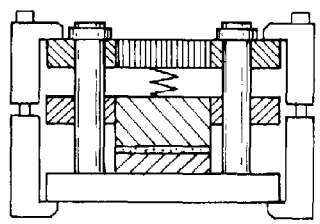
Figure 13C:
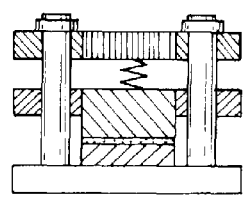
Figure 13D:
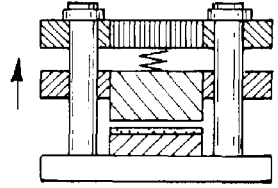
Figure 13E:
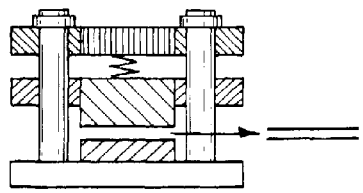
Figure 14:
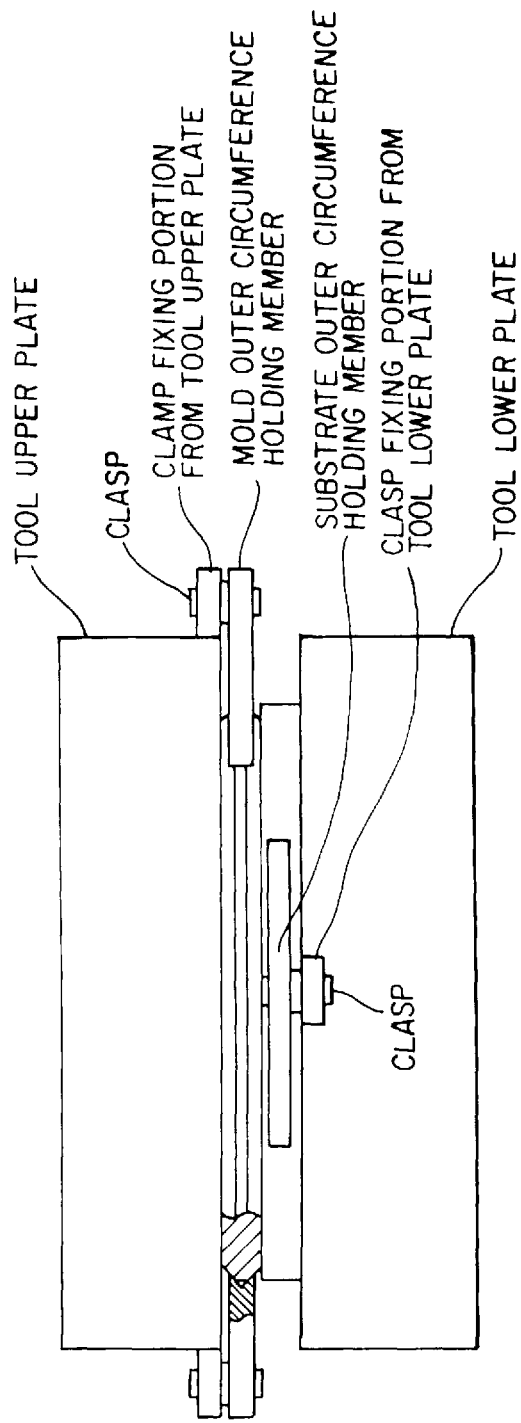
FIG. 14 is a view showing a state where mold and substrate outer circumference holding members are attached to tool upper and lower plates respectively.

FIGS. 13A to 13E show a releasing procedure in the release unit. In the release unit, the fixing arms of the precision tool are screwed down as shown in FIG. 13A and removed as shown in FIG. 13B. Then, the mold outer circumference holding member is attached to the tool upper plate and the substrate outer circumference holding member is attached to the tool lower plate as shown in FIG. 13C. FIG. 14 shows this state. Then, the tool upper plate is lifted up as shown in FIG. 13D so that the mold and the substrate are separated from each other as shown in FIG. 13E. Because the upper surface of the tool upper plate is fixed to the lower surface of the guide bush board so that the guide bush board can move only vertically through the guide pins, the mold and the substrate are separated from each other in a direction perpendicular to the pattern surface. Then, the substrate and mold outer circumference holding members are removed from the precision tool and the substrate and the mold are removed from the substrate and mold outer circumference holding members respectively and conveyed to the unloader unit. The precision tool is conveyed to the press unit.

In the unloader unit, the substrates and the molds after pattern imprinting are inserted one by one into cassettes respectively. The cassette containing a predetermined number of substrates is conveyed to the next process in the magnetic recording medium production while the cassette containing a predetermined number of molds is subjected to necessary processes such as cleaning and then conveyed to the loader unit. Specifically, the procedure in the unloader unit is reverse to the procedure in the loader unit, so that when the outer circumference holding member is removed, each substrate or mold is held once in the inner circumference receiving jig and put into the cassette by the push pin.

Various devices such as a belt conveyor and a car type conveyor can be used as the conveying device. As is obvious from the above description, conveyance is performed in a state where the substrate-mold pair is fixed by the outer circumference holding members or by the precision tool.

Imprinting using this apparatus configuration is performed as follows. First, a substrate coated with a resist and a mold are put into the loader unit. Then, the substrate and the mold are conveyed to the alignment unit, so that the mold is aligned with the substrate by the alignment unit. Then, the substrate and the mold are conveyed to the press unit, so that the mold is pressed against the substrate by the press unit. Then, the substrate and the mold are conveyed to the press+UV irradiation unit, so that UV irradiation is performed on the substrate and the mold in the state that the mold is pressed against the substrate. Then, the substrate and the mold are conveyed to the release unit, so that the mold is released from the substrate by the release unit. Then, the substrate and the mold are conveyed to the unloader unit, so that the substrate having the patterned resist and the mold are unloaded by the unloader unit.

Into the loader unit from which the substrate and the mold have been already conveyed to the alignment unit, a next substrate and a next mold are put at appropriate timing in consideration of the time required for processing in each unit. Then, as the substrate and the mold move to the next step, a next substrate and a next mold are conveyed to a free unit in the same manner as described above. That is, the mold and the substrate paired with each other are processed in an assembly line in accordance with each step.

Figure 2:
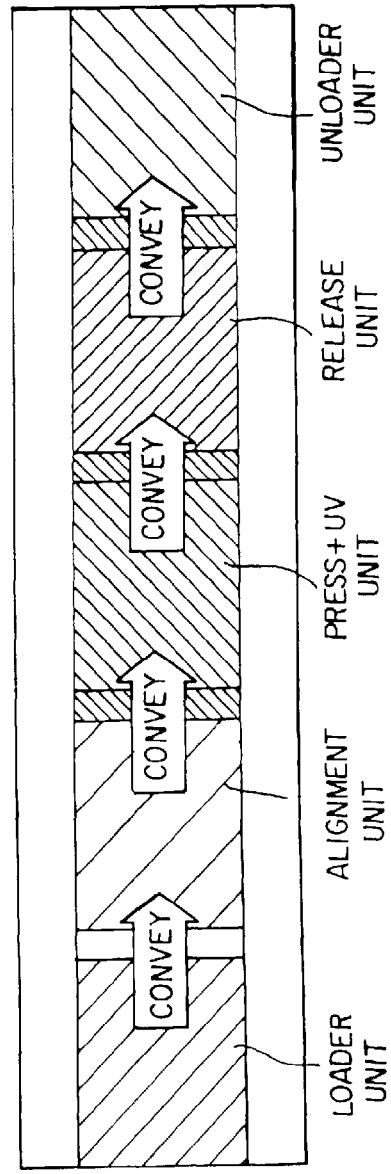
FIG. 2 is a schematic view showing another example of configuration of the apparatus according to the invention as the configuration of an apparatus according to a second embodiment of the invention.

FIG. 2 shows another example of configuration of the apparatus according to the invention. In this configuration example, the apparatus includes a loader unit, an alignment unit, a composite unit (press+UV irradiation unit), a release unit, and an unloader unit. Conveying devices are provided between the loader unit and the alignment unit, between the alignment unit and the composite unit (press+UV irradiation unit), between the composite unit and the release unit and between the release unit and the unloader unit, respectively.

The difference between the embodiment shown in FIG. 2 and the embodiment shown in FIG. 1 is as follows. In the embodiment shown in FIG. 2, the press unit for pressing the mold against the substrate is integrated with the press+UV irradiation unit for performing UV irradiation on the mold and the substrate in the state that the mold is pressed against the substrate.

Although this configuration has a merit that the apparatus can be formed compactly, this configuration has a problem that a long time is required for the press+UV irradiation unit. Accordingly, this configuration is suitable for the case where a relatively long time is required for alignment so that the press+UV irradiation step does not become a bottleneck.

Figure 3:
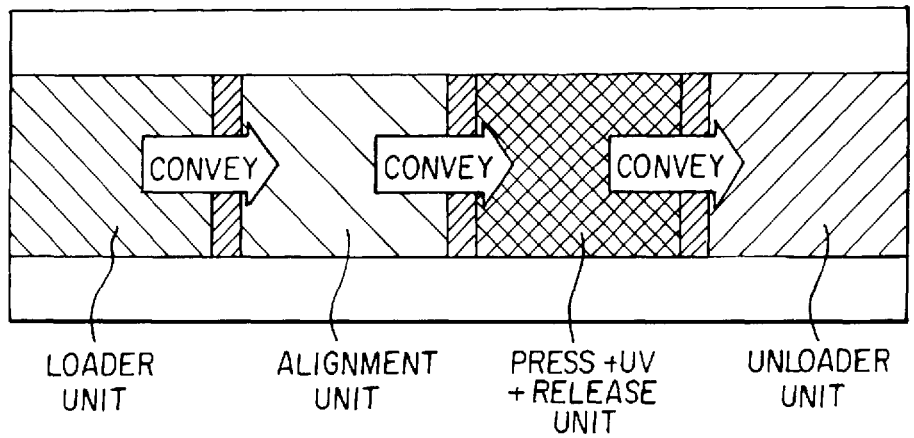
FIG. 3 is a schematic view showing a further example of configuration of the apparatus according to the invention as the configuration of an apparatus according to a third embodiment of the invention.

FIG. 3 shows a further example of configuration of the apparatus according to the invention different from the examples shown in FIGS. 1 and 2. In this configuration example, the apparatus includes a loader unit, an alignment unit, a composite unit (press+UV irradiation+release unit), and an unloader unit. Conveying devices are provided between the loader unit and the alignment unit, between the alignment unit and the composite unit (press+UV irradiation+release unit) and between the composite unit and the unloader unit, respectively. That is, the difference between the embodiment shown in FIG. 3 and the embodiment shown in FIG. 1 is as follows. In the embodiment shown in FIG. 3, the press unit for pressing the mold against the substrate, the UV irradiation unit for performing UV irradiation on the mold and the substrate in the state the mold is pressed against the substrate and the release unit for releasing the mold from the substrate are integrated into one.

This configuration is suitable for the case where a relatively long time is required for alignment and the aspect ratio of the pattern depth to the pattern width is small enough to ignore the time required for the release step so that the press+UV irradiation+release unit does not become a bottleneck.

The invention is not limited to the embodiments shown in FIGS. 1 to 3 and any configuration can be used if imprinting can be performed efficiently in consideration of the tact time required for each unit. For example, units may be configured so that the alignment step and the first press step are integrated into one.

Figure 4:
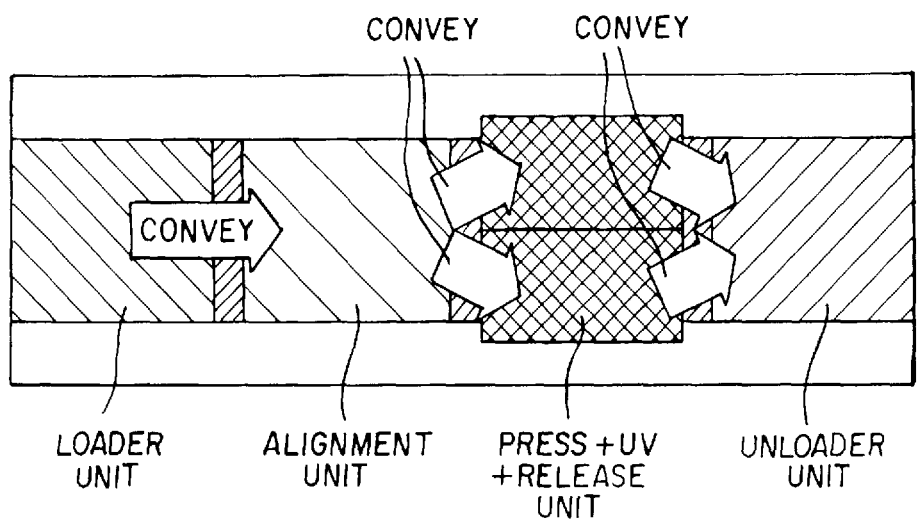
FIG. 4 is a schematic view showing a further example of configuration of the apparatus according to the invention as the configuration of an apparatus according to a fourth embodiment of the invention.

In the imprinting apparatus according to the invention, two or more units long in tact time may be provided in parallel with each other in accordance with the tact time of each unit. FIG. 4 shows an example of such configuration of the apparatus. That is, FIG. 4 shows the case where two press+UV irradiation+release units are arranged in parallel with each other. In this example, after alignment, the mold and the substrate are conveyed from the alignment unit to one of the two press+UV irradiation+release units and subjected to press, UV irradiation and release in the press+UV irradiation+release unit. On the other hand, a next mold-substrate pair is conveyed to the alignment unit and subjected to alignment in the alignment unit. Even if the alignment is completed, processing in the press+UV irradiation+release unit cannot be completed because the tact time of the press+UV irradiation+release unit is longer than that of the alignment unit. Therefore, after the alignment, the mold-substrate pair is conveyed to the other press+UV irradiation+release unit and processed. Consequently, imprinting can be performed more efficiently without any bottleneck in the longest tact time of the press+UV irradiation+release unit. The parallel arrangement type imprinting apparatus is not limited to the example shown in FIG. 4 and three units may be arranged in parallel and two alignment units may be further arranged in parallel.

In the imprinting apparatus according to the invention, it is preferable that a decompression device is provided at least in an apparatus region of from the conveying device following the alignment unit to the UV irradiation unit. In this case, in the imprinting apparatus according to the invention, the apparatus region of from the conveying device following the alignment unit to the UV irradiation unit may be contained in an apparatus which can be decompressed, or the conveying device following the alignment unit, the respective units in a range of from the conveying device to the UV irradiation unit and the respective conveying devices for connecting these units may have decompression devices individually. When the UV irradiation unit is provided as a composite unit including a release unit, the composite unit can be decompressed.

Although embodiments in which the imprinting apparatus according to the invention is applied to production of hard disks will be described in detail, the invention is not limited to these embodiments but can be applied to any other mode belonging to the spirit of the invention.

Figure 5:
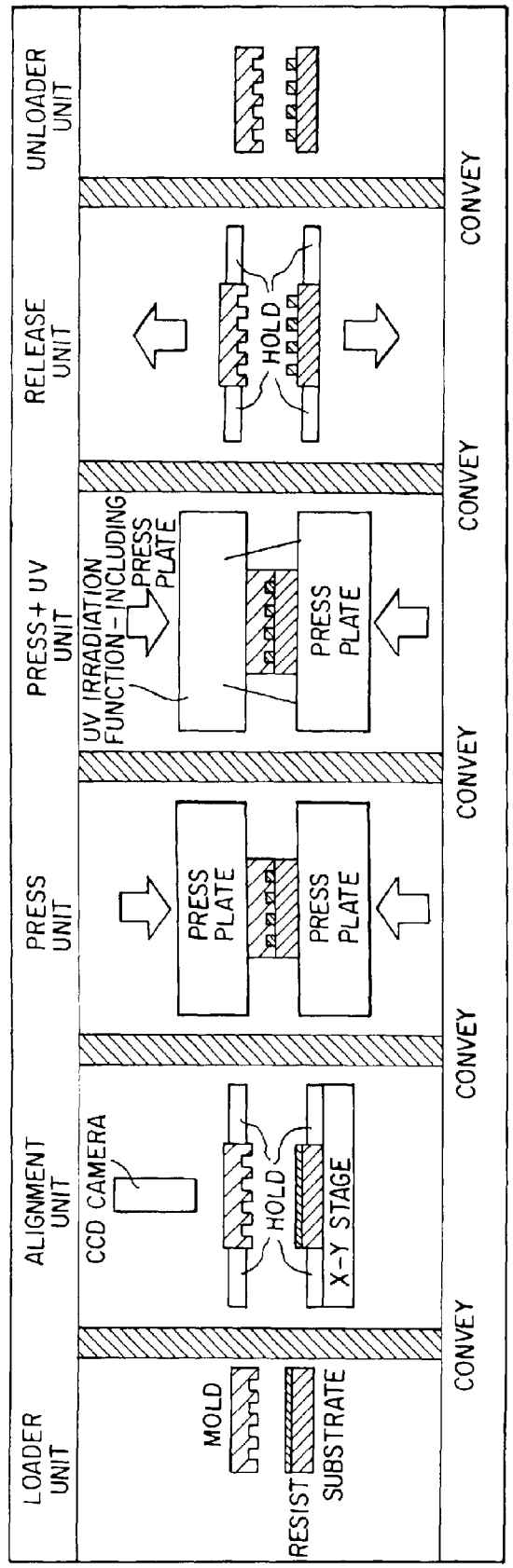
FIG. 5 is a schematic view showing the configuration of the apparatus according to a first embodiment of the invention.

As shown in FIG. 5, the imprinting apparatus according to this first embodiment is separated into six zones, that is, a loader unit, an alignment unit, a press unit, a press+UV irradiation unit, a release unit and an unloader unit. A mold and a substrate paired with each other are conveyed between the respective units to perform an imprinting process.

First, a mold having a protruding and recessing pattern formed in a transfer surface and a substrate coated with a photo-curing type resist were put into the loader unit. In this embodiment, a 6.35 mm-thick 70 mm-square glass base plate coated with a 1 μm-thick transparent resin having a pattern of concentric circles with a pattern depth of 120 nm and a half pitch of 100 nm was used as the mold. A 2.5-inch-diameter magnetic recording medium having a 20 mm-diameter central hole and coated with a 60 nm-thick resist PAK-01 (made by Toyo Gosei Co., Ltd.) by a spin coater was used as the resist-coated substrate. Then, the loaded mold and substrate paired with each other were conveyed to the alignment unit.

In the alignment unit, the substrate was fixed to an X-Y stage (movable in X and Y directions) and the mold was fixed. In this state, the mold and the substrate were aligned with each other in such a manner that the X-Y stage to which the substrate was fixed was moved while a marker of the mold and a designated point of the substrate were observed through the mold by a CCD camera. In this embodiment, the alignment was performed as follows. Three points on the mm-diameter inner circumference of the magnetic recording medium were observed to determine the center of the substrate. The center of the mold was determined based on the marker of the mold located in points designated in advance. The X-Y stage was moved by a quantity corresponding to the difference between the center of the substrate and the center of the mold to thereby align the mold and the substrate with each other.

After the alignment of the mold and the substrate, outer circumference holding members holding the substrate and the mold respectively were fixed so that the relative positions of the mold and the substrate were not displaced. In this state, the mold and the substrate were conveyed to the press unit. On this occasion, the mold and the substrate were fixed so as to be in tight contact with each other. The tight contact between the mold and the substrate after the alignment of the mold and the substrate permits the difference between the relative positions to be more suppressed when the mold and the substrate are conveyed.

In the press unit, the pattern surface of the mold was pressed against the resist surface of the resist-coated substrate under a predetermined pressure for a predetermined time. The precision tool thus pressed was fixed by the fixing arms. Because the pattern surface of the mold was pressed against the resist surface of the substrate under the predetermined pressure for the predetermined time, undulation of the substrate surface was formed to imitate the undulation of the mold surface while the resist was fluidized to the pattern of the mold. In this manner, a resist pattern uniform in the substrate surface was obtained. In this embodiment, the pressed state under a pressure of 1 MPa for 10 seconds was kept.

Then, the precision tool in which the mold and the substrate were held as to be in tight contact with each other and which was fixed by the fixing arms was conveyed to the UV irradiation unit.

In the UV irradiation unit, the substrate in the precision tool fixed by the fixing arms was irradiated with UV light for 10 seconds to harden the resist. In practice, ultraviolet light-transmissible glass transparent to ultraviolet light was used as a press plate and a UV light source made of a LED emitting UV wavelength light was disposed through the press plate. The mold and the substrate held so as to be in tight contact with each other were set between the upper press plate provided with the UV light source and the lower press plate. When the mold was pressed against the substrate under the aforementioned pressure for the aforementioned time while the mold and the substrate were irradiated with UV light, the resist was hardened reacting to the UV light penetrating the mold.

Then, the precision tool in which the mold and the substrate were held as to be in tight contact with each other and which was fixed by the fixing arms was conveyed to the release unit.

In the release unit, the substrate holding member and the mold holding member were separated from each other perpendicularly to the patterned surfaces of the substrate and the mold respectively to thereby release the mold from the substrate. In this embodiment, the mold was released from the substrate while moved to a perfectly separate position without adhesion strength at a relatively low speed of 0.01 mm/sec.

Then, the mold and the substrate having the patterned resist were conveyed to the unloader unit and unloaded individually by the unloder unit.

Incidentally, in this embodiment, operations in a range of from conveyance following alignment to UV irradiation were performed under reduced pressure in a series of units.

When a series of nano-imprinting steps are performed on an assembly line while a large number of clone molds copied from a prototype mold and this apparatus are used, nano-imprinting can be performed efficiently in a short tact time.

This second embodiment uses an imprinting apparatus configured as shown in FIG. 2. The configuration of this apparatus is the same as the configuration of the apparatus according to first embodiment, except that the independent press unit is removed.

In this embodiment, the region of from the loader unit to conveyance following the alignment unit and the region of from conveyance following the UV irradiation unit to the unloader unit were configured to be the same as those in the first embodiment.

In the press+UV irradiation unit, the mold and the substrate were held under a pressing pressure of 1 MPa for 10 seconds while the resist was fluidized to the pattern of the mold so that undulation of the substrate surface was formed to imitate the undulation of the mold surface. Then, the mold and the substrate were held as they were under the pressing pressure of 1 MPa (in a state where the precision tool was fixed by the fixing arms) for 10 seconds while irradiated with UV light to harden the resist.

This embodiment has a merit that the apparatus can be formed compactly but has a demerit that a long time is required for processing in the press+UV irradiation unit, compared with the first embodiment. However, because an expensive prototype mold produced by electron beam exposure is used, nano-imprinting can be performed efficiently in a short tact time compared with the background-art imprinting method using one mold for subjecting substrates one by one to a series of nano-printing steps.

The third embodiment uses an imprinting apparatus configured as shown in FIG. 3. The configuration of this apparatus is the same as the configuration of the apparatus according to the first embodiment, except that the independent press unit is removed and the release unit is integrated with the press+ UV irradiation unit to form a press+UV irradiation+release unit.

In this embodiment, the region of from the loader unit to conveyance following the alignment unit and the region of from conveyance following the release unit to the unloader unit were configured to be the same as those in the first embodiment.

In the press+UV irradiation+release unit, the mold and the substrate were held under a pressing pressure of 1 MPa for 10 seconds while the resist was fluidized to the pattern of the mold so that undulation of the substrate surface was formed to imitate the undulation of the mold surface. Then, the mold and the substrate were held as they were under the pressing pressure of 1 MPa for 10 seconds while irradiated with UV light to harden the resist.

This embodiment has a merit that the apparatus can be formed to be remarkably compact but has a demerit that a long time is required for processing in the press+UV irradiation+release unit, compared with the first embodiment. However, because an expensive prototype mold produced by electron beam exposure is used, nano-imprinting can be performed efficiently in a short tact time compared with the background-art imprinting method using one mold for subjecting substrates one by one to a series of nano-printing steps.

The fourth embodiment uses an imprinting apparatus configured as shown in FIG. 4. The configuration of this apparatus is the same as the configuration of the apparatus according to the third embodiment, except that two press+UV irradiation+release units are arranged in parallel. The arrangement of the two press+UV irradiation+release units permits throughput per unit time of the units to be improved to about twice, so that the apparatus can be configured relatively compactly to reduce the number of conveyance steps.

The invention has been described with reference to certain preferred embodiments thereof. It will be understood, however, that modifications and variations are possible within the scope of the appended claims.

This application is based on, and claims priority to, Japanese Patent Application No: 2008-111761, filed on Apr. 22, 2008. The disclosure of the priority application, in its entirety, including the drawings, claims, and the specification thereof, is incorporated herein by reference.

What is claimed is:

1. An imprinting method for forming a predetermined pattern in a resist surface of a substrate coated with a photo-curing type resist by using a plurality of molds, each mold of the plurality of molds having a pattern of projections and recesses formed in a transfer surface, comprising the steps of:
   aligning, for each mold of the plurality of molds, the pattern of the mold with a predetermined position of the substrate;
   pressing, for each mold of the plurality of molds, the pattern surface of the mold against the resist surface of the resist-coated substrate;
   irradiating, for each mold of the plurality of molds, the resist with ultraviolet light to cure the resist; and
   releasing, for each mold of the plurality of molds, the mold from the substrate;
   wherein the steps in the imprinting method are performed in a plurality of units selected from a) independent units in each of which one step is executed, b) composite units in each of which a plurality of steps are executed, and c) combinations of independent units and composite units; and wherein the mold and the substrate are paired with each other as they are conveyed between the units; and
   wherein one to three of the imprinting steps of aligning, pressing, irradiating and releasing can each selectively be performed by at least two units, with the two units being arranged in parallel; and
   wherein at least one of the plurality of molds is disposed at each of the two units in parallel.

2. An imprinting method according to claim 1, wherein the mold and the substrate are conveyed following the aligning in tight contact with each other.

3. An imprinting method according to claim 1, wherein the mold and the substrate are conveyed by conveying devices; and
   wherein at least steps, and the conveyance by conveying devices between the steps, ranging from the conveyance following the alignment to the UV irradiation are performed under reduced pressure.

4. An imprinting method according to claim 2, wherein at least steps ranging from the conveyance following the alignment to the UV irradiation are performed under reduced pressure.

5. An imprinting method according to claim 1, wherein the mold and the substrate are conveyed by independent conveying devices that are disposed at upstream and downstream positions of a plurality of the units.

* * * * *